United States Patent [19]

Leyde et al.

[11] Patent Number: 5,632,280
[45] Date of Patent: May 27, 1997

[54] METHOD FOR CIRCUIT FAULT DETECTION IN DIFFERENTIAL SIGNAL DETECTORS

[75] Inventors: Kent W. Leyde, Redmond; Thomas D. Lyster, Bothell; Daniel J. Powers, Issaquah, all of Wash.

[73] Assignee: Heartstream, Inc., Seattle, Wash.

[21] Appl. No.: 685,999

[22] Filed: Jul. 25, 1996

Related U.S. Application Data

[62] Division of Ser. No. 398,377, Mar. 3, 1995.
[51] Int. Cl.$^6$ ......................................... A61B 5/04
[52] U.S. Cl. ........................... 128/696; 324/123 R; 332/2; 332/69; 332/258; 606/35
[58] Field of Search ....................... 330/2, 69, 258; 128/696, 908; 324/123 R, 123 C; 606/35; 607/63

[56] References Cited

U.S. PATENT DOCUMENTS

| | | |
|---|---|---|
| 3,559,193 | 1/1971 | Savaglio et al. . |
| 3,580,243 | 5/1971 | Johnson . |
| 3,602,215 | 8/1971 | Parnell . |
| 3,732,859 | 5/1973 | Tateno . |
| 3,868,947 | 3/1975 | Holsinger . |
| 3,905,364 | 9/1975 | Cudahy et al. . |
| 4,037,170 | 7/1977 | Richards . |
| 4,112,930 | 9/1978 | Feldman et al. . |
| 4,162,456 | 7/1979 | Lukes . |
| 4,194,511 | 3/1980 | Feldman . |
| 4,200,109 | 4/1980 | McMorrow, Jr. . |
| 4,243,044 | 1/1981 | Blancke . |
| 4,291,699 | 9/1981 | Geddes et al. . |
| 4,533,876 | 8/1985 | Haque et al. . |
| 4,598,281 | 7/1986 | Maas . |
| 4,610,254 | 9/1986 | Morgan et al. . |
| 4,619,265 | 10/1986 | Morgan et al. . |
| 4,796,638 | 1/1989 | Sasaki . |
| 4,896,120 | 1/1990 | Kamil . |
| 4,917,099 | 4/1990 | Stice . |
| 4,919,145 | 4/1990 | Marriott . |
| 4,993,423 | 2/1991 | Stice . |
| 5,002,063 | 3/1991 | Haner . |
| 5,020,541 | 6/1991 | Marriott . |
| 5,025,808 | 6/1991 | Hafner . |
| 5,107,849 | 4/1992 | Bellin et al. . |
| 5,392,784 | 2/1995 | Gudattis ................... 128/696 |
| 5,474,574 | 12/1995 | Payne et al. . |

OTHER PUBLICATIONS

Shepard, "The optimization of common mode" *Electronic Engineering* 54(672):31 (1982).
Klijn, J.A.J., "Movement Artifact Suppressor During ECG Monitoring" *Cardivascular Res.* 8:149–152 (1974).
Thakor, N.V., "Electrode Studies for the Long–Term Ambulatory ECG" *Med. & Bio. Eng. & Comput.* 23:116–121 (1985).
Taub "Differential Amplifier with High Input Impedence" *IBM Technical Disclosure Bulletin* vol. 9, No. 11, pp. 1637–1638 (Apr. 1967).

*Primary Examiner*—James B. Mullins
*Attorney, Agent, or Firm*—Morrison & Foerster

[57] ABSTRACT

The present invention is an apparatus and method for detecting differential mode signals in an environment where differential mode signals co-exist, and might be corrupted by, common mode signals. The most basic apparatus of the present invention essentially comprises first and second input leads through which both differential mode and common mode signals are input; a first amplifier block having a gain that is substantially one; and at least an inverting node and a non-inverting node connected to the first and second input leads. The output of the amplifier block is fed back to the input of the non-inverting node of the amplifier block in a manner to increase differential mode impedance while maintaining a low common mode impedance. Various embodiments of the basic presently claimed circuitry provides for additional methods of monitoring the level of common-mode signal introduced to the apparatus and other fault detection functions.

6 Claims, 16 Drawing Sheets

METHOD FOR CIRCUIT FAULT DETECTION IN DIFFERENTIAL SIGNAL DETECTORS

This application is a DIVISIONAL of application Ser. No. 08/398,377 filed Mar. 3, 1995.

FIELD OF THE INVENTION

The present invention relates in general to sensing common mode signals appearing at an instrumentation package and, in particular, to detecting common mode signals introduced into an input signal and faults in the detector circuitry.

BACKGROUND OF THE INVENTION

The presence of common mode signals in instrumentation systems that are primarily interested in monitoring differential mode signals is a common phenomenon. A paradigm of such a system is a heart monitor and defibrillator. The monitor is primarily interested in detecting the differential mode voltage signals of a patient's heart and displaying it as a familiar electrocardiogram (ECG) reading. Nevertheless, interfering signals can be introduced into such systems that can masquerade as differential signals of interest. One source of such interfering signals is called "common-mode" signals which can manifest system outputs as if arising from differential sources, such as the patient's heart. The introduction of these common mode signals into such a system is a nuisance at best to the optimal functioning of the system, and at worst, potentially harmful to the patient under certain circumstances.

Referring to FIG. 1, a simplified illustration of how common mode signals are introduced into a typical instrumentation system, such as system 10, is depicted. System 10 consists of electrodes 16a and 16b electrically connecting patient 12 to instrumentation package 14. Instrumentation 14 is used to either detect certain patient conditions or to effect changes in a patient's state or both. In the case of the heart monitor and defibrillator, the monitor detects a state of fibrillation in a patient's heart and the defibrillator administers a electric shock to return the patient's heart to a non-fibrillating state.

The introduction of a common mode signal into this system can lead to either false positive indications of patient fibrillation when the patient's heart is actually functioning properly or false negative indications of a normal patient when the patient is actually experiencing fibrillation. Either situation can have very serious consequences—inducing a shock from the defibrillator when none is needed in the first instance or inducing inaction in the defibrillator when a life-saving shock is needed in the second instance.

A complete common mode circuit is depicted in FIG. 1. Typically, an outside common mode voltage source 18 drives a common mode current 20 from earth ground 22 through patient 12 and instrumentation 14. Stray capacitance between the earth and patient and the earth and instrumentation (represented by capacitors 24 and 26) completes the common mode circuit. Changes in either the common mode voltage source or changes in stray capacitance 24 and 26 may induce a flow of common mode current 20.

A more detailed situation involving common mode signals is depicted in FIG. 2. In this case, the patient/instrumentation system 10 is subjected to a number of different sources of common mode signals. Common mode voltages may arise from a number of sources—for example, from static electricity arising from various interactions such as between patient 12 and earth 22, instrumentation 14 and earth 22, an individual 28 aiding the patient and earth, as well as from varying electric fields such as overhead lighting 36 and other electrical sources. Each of these interactions have their own common mode voltage and associated capacitance.

In the case of heart monitoring for a defibrillator, the common mode signals generated from these various sources may have a significant impact on the qualitative and quantitative analysis of a true electrical signal generated by the heart of a patient. The main reason is that the electrical signal of the heart is comparatively small. By contrast, the common mode signals generated from the sources mentioned above may vary in intensity and may be orders of magnitude larger.

Sometimes a common mode signal may be so strong as to dominate the "overall" signal (i.e. the output resulting from the common mode signal superimposed over the output signal resulting from the differential signal from the patient's heart) received at the instrumentation. If such an overpowering common mode signal were to vary at the rate of a few Hertz (as many common mode signals do), then the instrumentation may interpret the received signal as a heart in a state of fibrillation. This false positive reading might induce the instrumentation to deliver an electric shock to a patient whose heart is actually operating properly—a confusing and potentially harmful situation.

Likewise, a large common mode signal may be generated with a pattern similar to a correctly beating heart. In such a case, the instrumentation may interpret the received signal as a heart in a normal beating state. This false negative reading would not enable the defibrillator to deliver a life-saving shock to a patient whose heart has stopped beating properly—which may result in a failure to resuscitate the victim.

Actual test situations and their results are shown in FIGS. 3A and 3B, 4A and 4B, and 5A and 5B. In these tests, a common mode current was injected into a heart monitoring system that was concurrently monitoring the heart rhythms of a pig used as a test subject. Common mode current, induced into the monitoring system, is graphed as a function of time in FIGS. 3A, 4A, and 5A. The signal received (i.e. a superposition of the common mode signal and heart signal) by the instrumentation in each case is graphed in FIGS. 3B, 4B, and 5B. As will be discussed in greater detail in connection to FIG. 6 below, the common mode signal being superimposed is a combination of common mode signal that is "converted" to a differential mode signal (due to impedance mismatching) and common mode signal that is passed through an actual amplifier.

In FIG. 3A, a negligible common mode signal was injected into the system while the pig's heart was beating normally. The received signal in FIG. 3B therefore registers a normal heart beat and the monitoring system therefore correctly interprets this signal to be a normally beating heart—one not needing to be shocked.

FIGS. 4A and 4B depict a "false positive" reading in the heart monitoring instrumentation. In FIG. 4A, a much stronger common mode current in injected at a varying rate of fluctuation. In this instance, this common mode signal is introduced at a time when the subject pig's heart is beating normally. However, since the common mode signal is much stronger than the subject heart signal, the received signal detected in FIG. 4B is dominated by the common mode signal. A likely diagnosis from a diagnostic system in such a case would be a state of fibrillation in the subject's heart and to recommend to the operator that a shock be delivered.

FIG. 5A and 5B depict another "false positive" reading. In FIG. 5A, the common mode signal arose as a result of an attempt at cardiopulmonary resuscitation (CPR) at a time when the subject pig's heart was beating normally. The CPR induced a common mode signal that has a look similar to a normal beating heart. However, when that signal is superimposed on the signal of an actual beating heart, the signal received in FIG. 5B may resemble a heart that is in a state of fibrillation when in fact the subject heart is beating normally.

It is thus highly desirable to alleviate the misdiagnosis of superimposed common mode signals. It is therefore an object of the present invention to design an instrumentation system, primarily interested in detecting differential mode signals, that detects any superimposed common mode signals.

SUMMARY OF THE INVENTION

Other features and advantages of the present invention will be apparent from the following description of the preferred embodiments, and from the claims.

The present invention is an apparatus and method for detecting differential mode signals in an environment where differential mode signals co-exist, and might be corrupted by, common mode signals. The most basic apparatus of the present invention essentially comprises first and second input leads through which both differential mode and common mode signals are input; a first amplifier block having a gain that is substantially one; and at least an inverting node and a non-inverting node connected to the first and second input leads. The output of the amplifier block is fed back to the input of the non-inverting node of the amplifier block.

As will be discussed, this basic apparatus provides a low corrosion-mode signal impedance together with a high differential-mode impedance. The advantage of keeping common-mode impedance low is so that typically small common mode currents are not translated into large common mode voltages (i.e. "large" with respect to instrumentation potential reference or "ground") that are undesirably passed through by the amplifier block—as if arising from differential sources. These passed-through common mode voltages are undesirable because they are subsequently superimposed upon differential mode voltages which may lead to the false-positive and false-negative diagnosis as described above.

On the other hand, a high differential mode impedance is desirable. Small differential-mode voltages, such as ECG voltages, also have high associated source impedances. Differential-mode input impedances, therefore, should be as high as possible to avoid attenuation of these signals prior to amplification.

One further embodiment of this apparatus comprises a known voltage source connected to the inverting node of the first amplifier block. The advantage of this embodiment is that it is possible to ascertain the differential mode impedance coming from the input leads. In the case of a defibrillator, this impedance generally is derived from the impedance of the electrode leads that are attached to the patient's torso. An unduly large impedance may signal that the leads have been improperly set on the patient. Thus, a method for monitoring patient impedance is provided.

A further embodiment of the presently claimed apparatus is having a second amplifier block stage connected to the input circuit of the first amplifier block. The second amplifier block takes advantage of relatively low common-mode impedances and high differential-mode impedances provided by the first amplifier block stage. The second stage preferentially converts common-mode currents flowing in the first stage input circuit into voltage signals as a function of those common-mode currents. Thus, a method for a quantitative measure of common-mode signal currents, and the possible corruption of differential-mode signals, is provided.

Yet another embodiment of the present invention provides a resistor on the each of the input leads to the first amplifier block. As will be discussed below, this embodiment provides for a method of fault detection in the presently claimed circuitry.

For a full understanding of the present invention, reference should now be made to the following detailed description of the preferred embodiments of the invention and to the accompanying drawings.

DETAILED DESCRIPTION OF THE INVENTION

Figure 1:
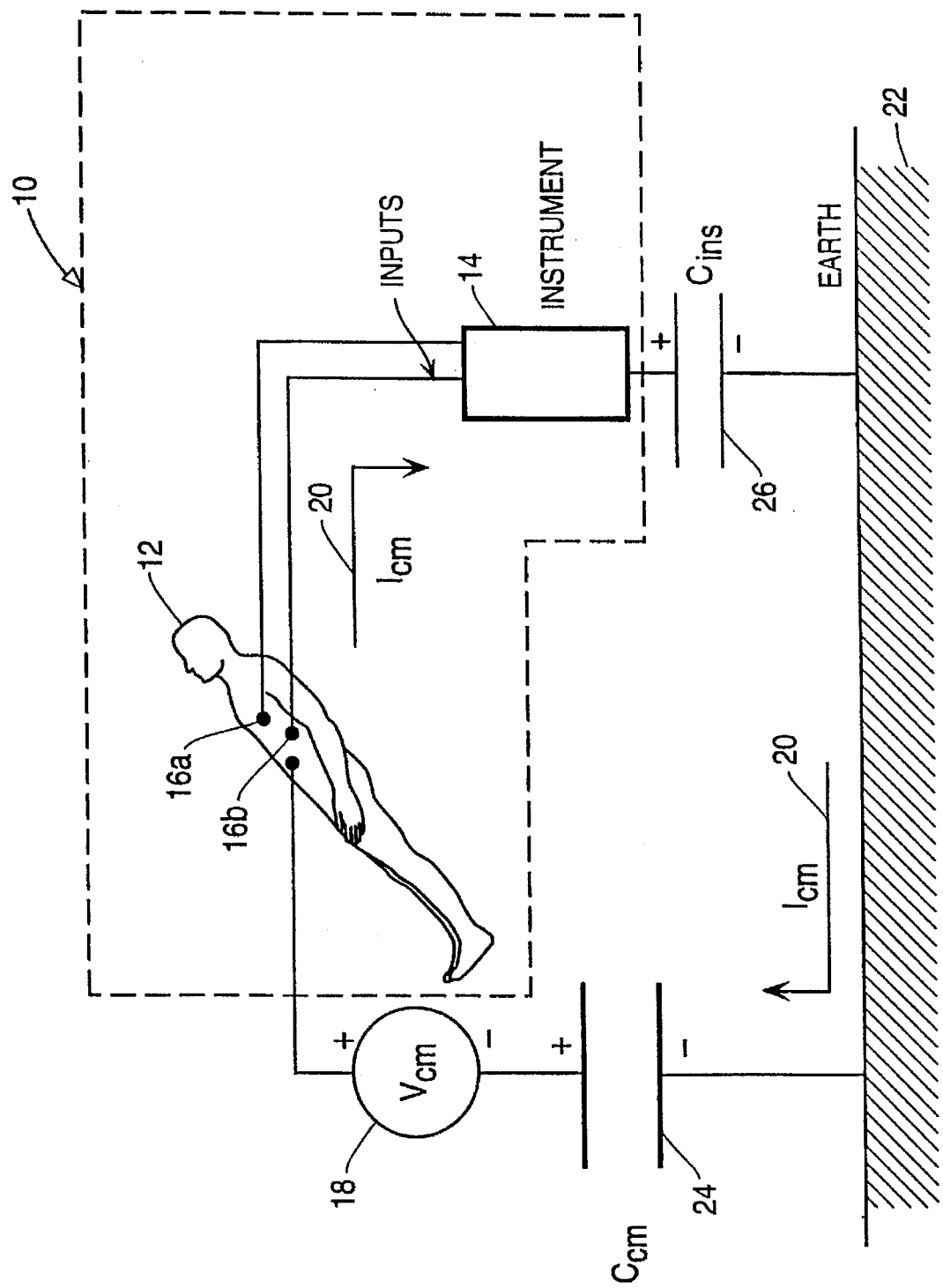
FIG. 1 is a simplified illustration of the introduction of common mode signals when a patient is connected to a instrumentation system.
Figure 2:
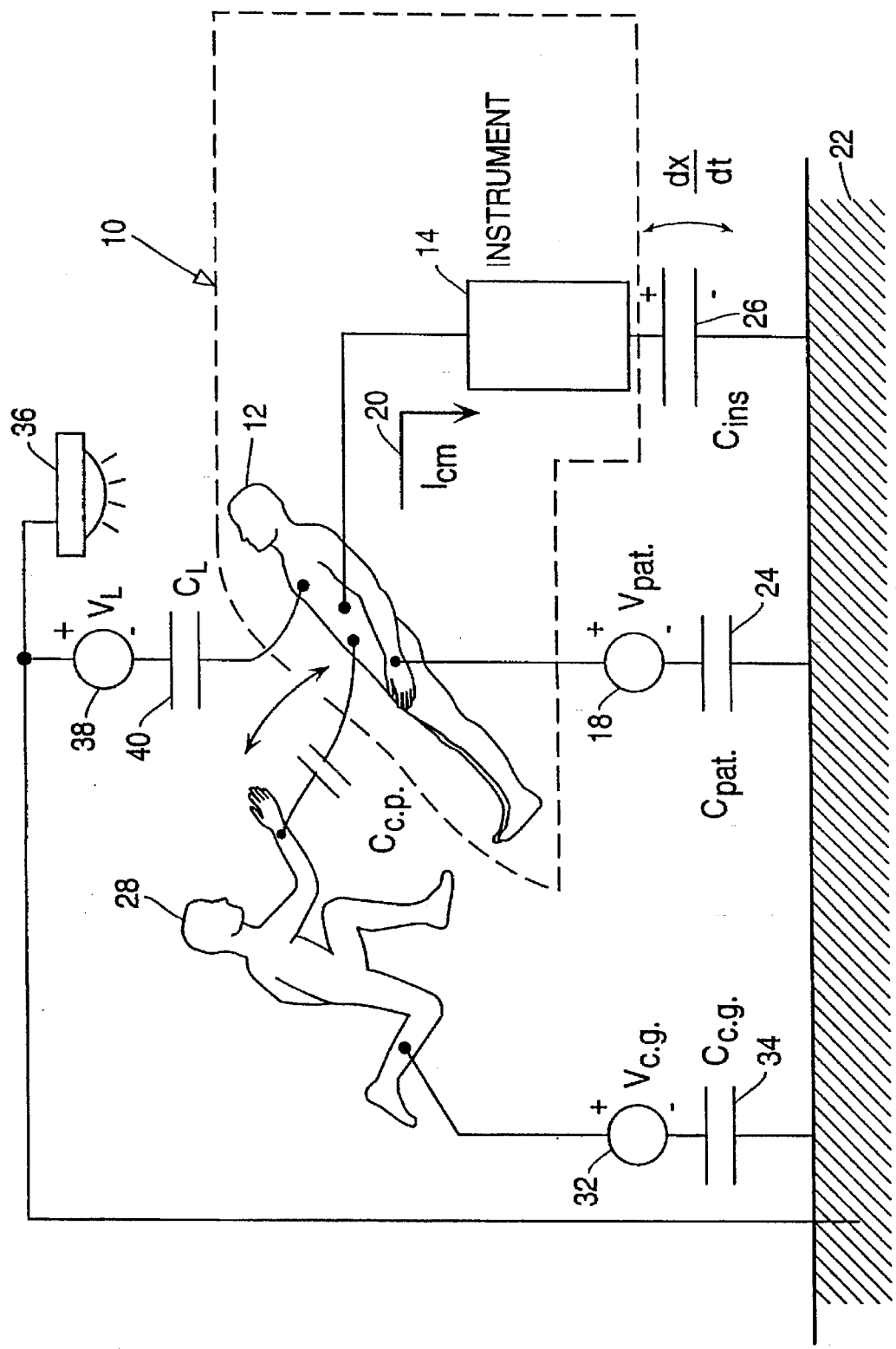
FIG. 2 is a more detailed illustration of how common mode signals are introduced into a patient/instrumentation system.
Figure 3A:
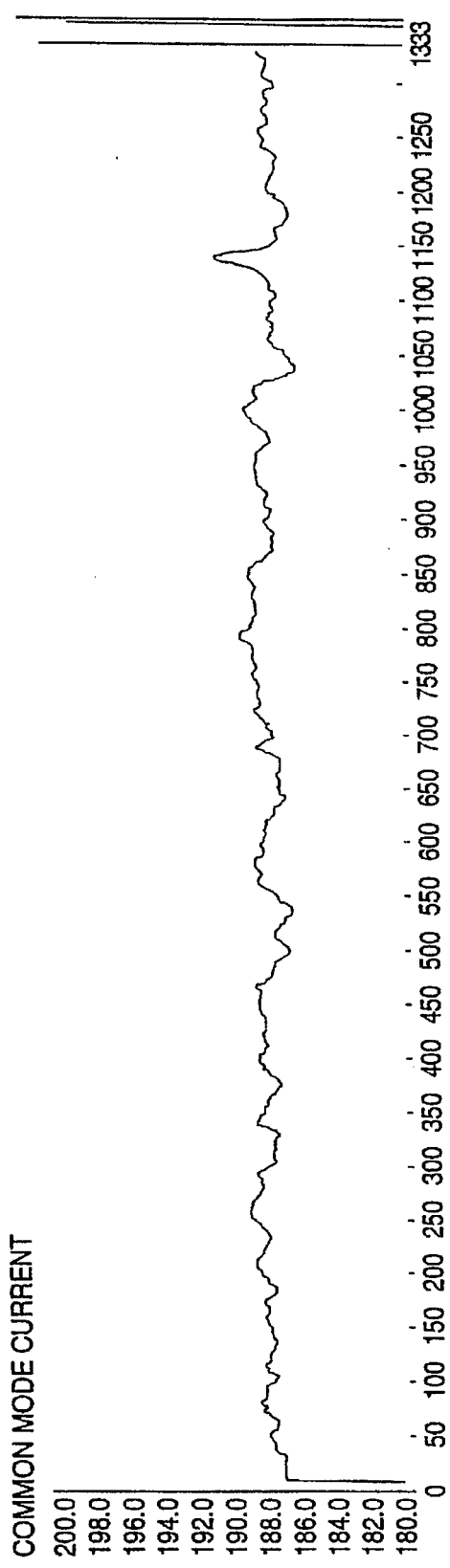
FIGS. 3A and 3B graphically depict a negligible common mode signal superimposed on a functioning patient heart beat signal and the output signal from the instrumentation respectively.
Figure 3B:
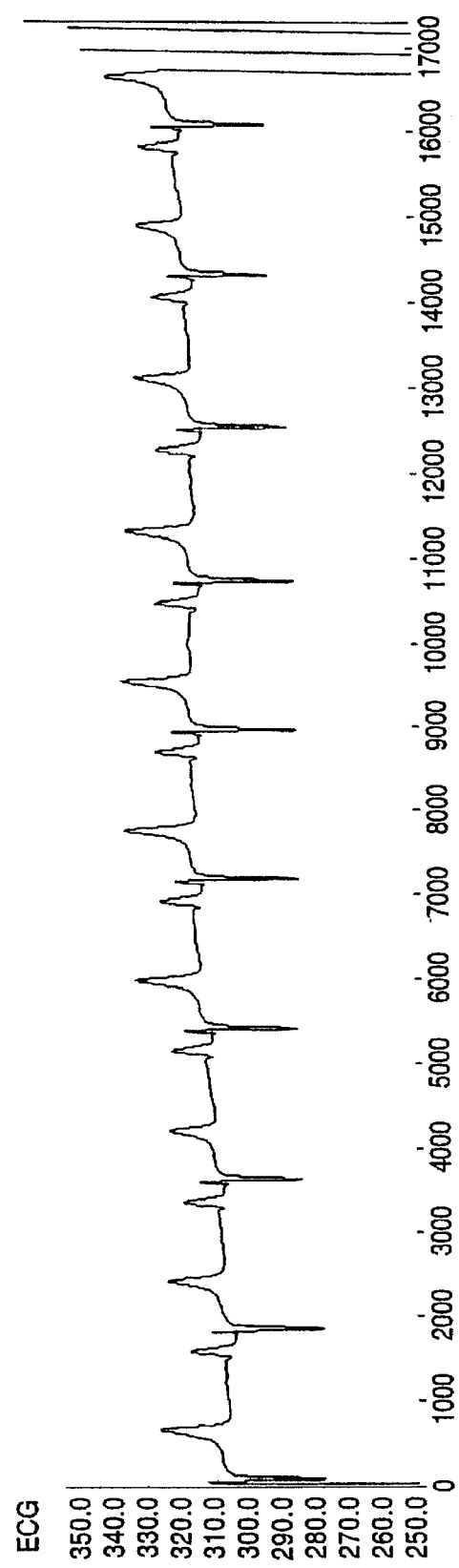
Figure 4A:
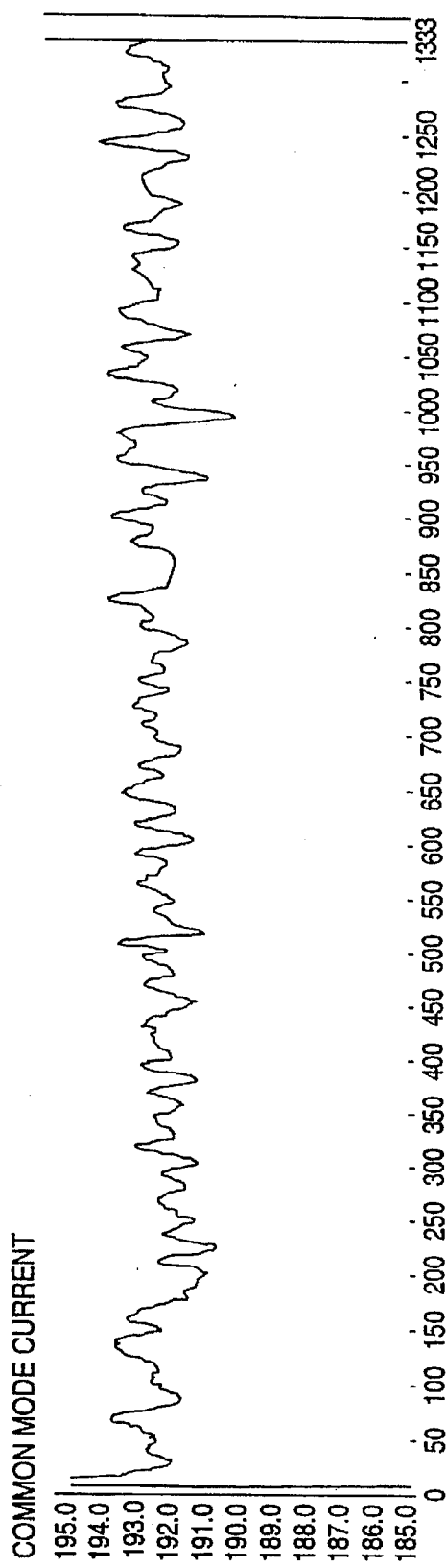
FIGS. 4A and 4B graphically depict a relatively strong common mode signal superimposed on a normal heart signal to give an output signal indicating a malfunctioning heart.
Figure 4B:
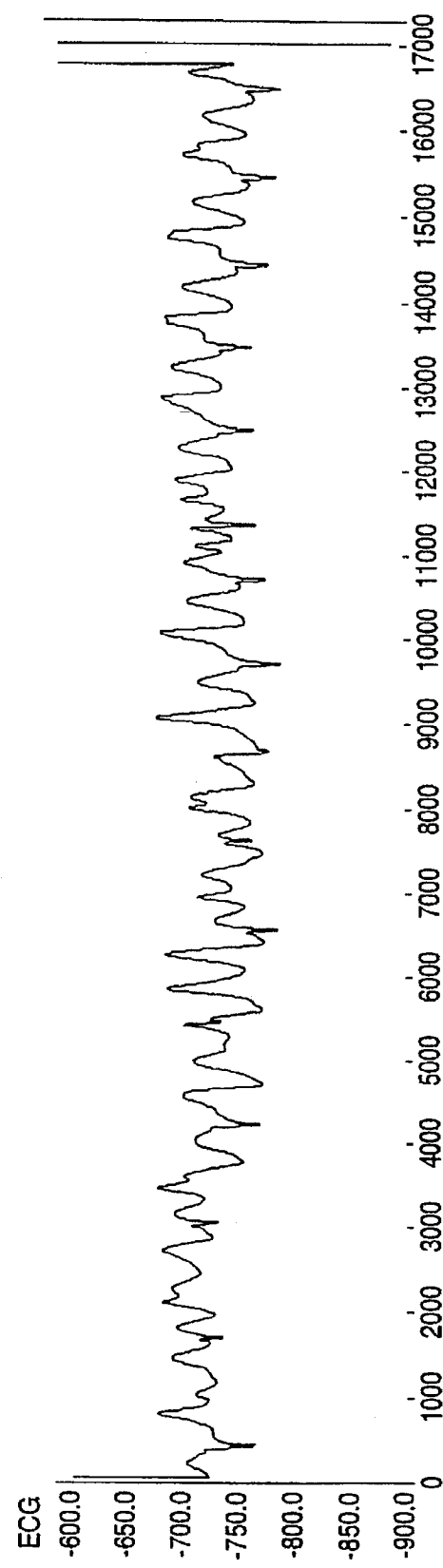
Figure 5A:
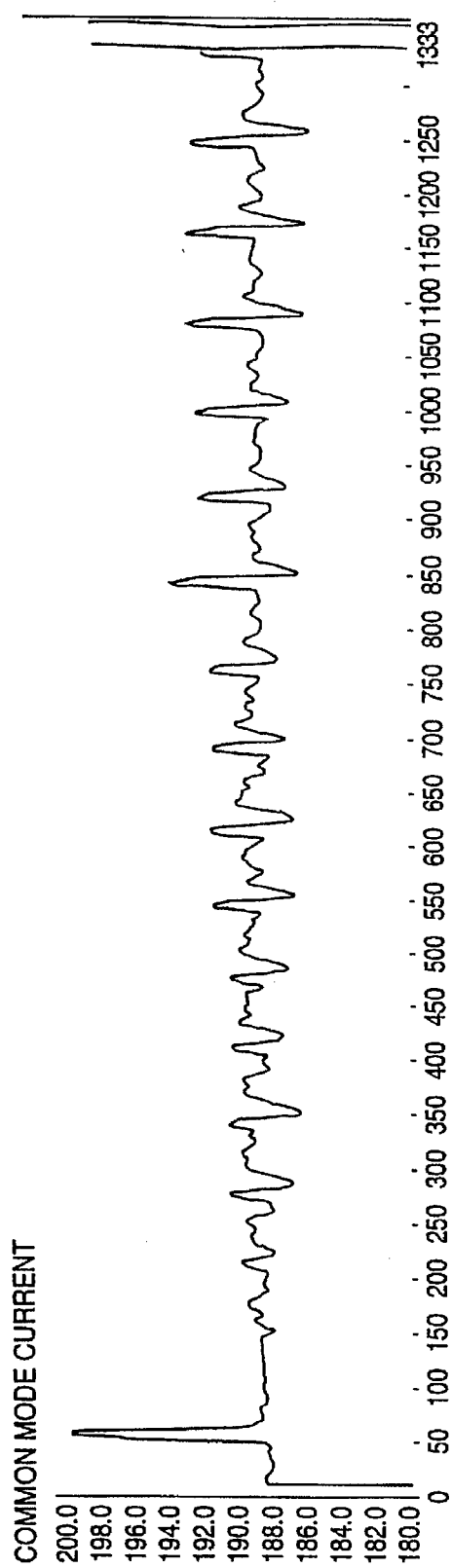
FIGS. 5A and 5B graphically depict a common mode signal that arises as the result of attempted cardiopulmonary resuscitation (CPR) superimposed on the signal of a normal heart signal to indicated a malfunctioning heart.
Figure 5B:
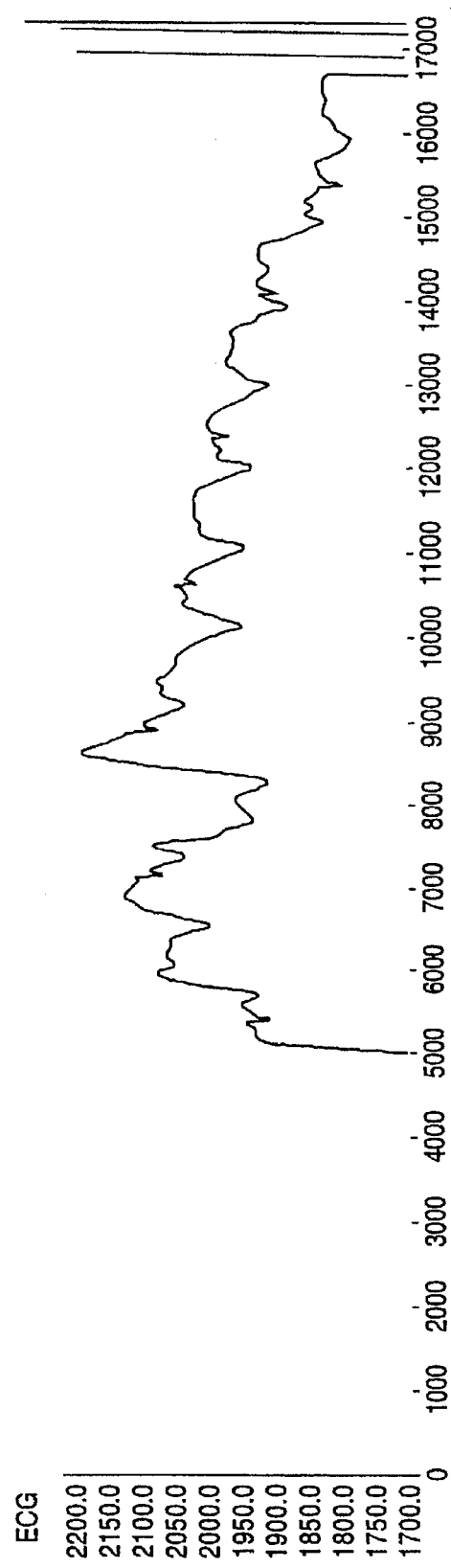
Figure 6:
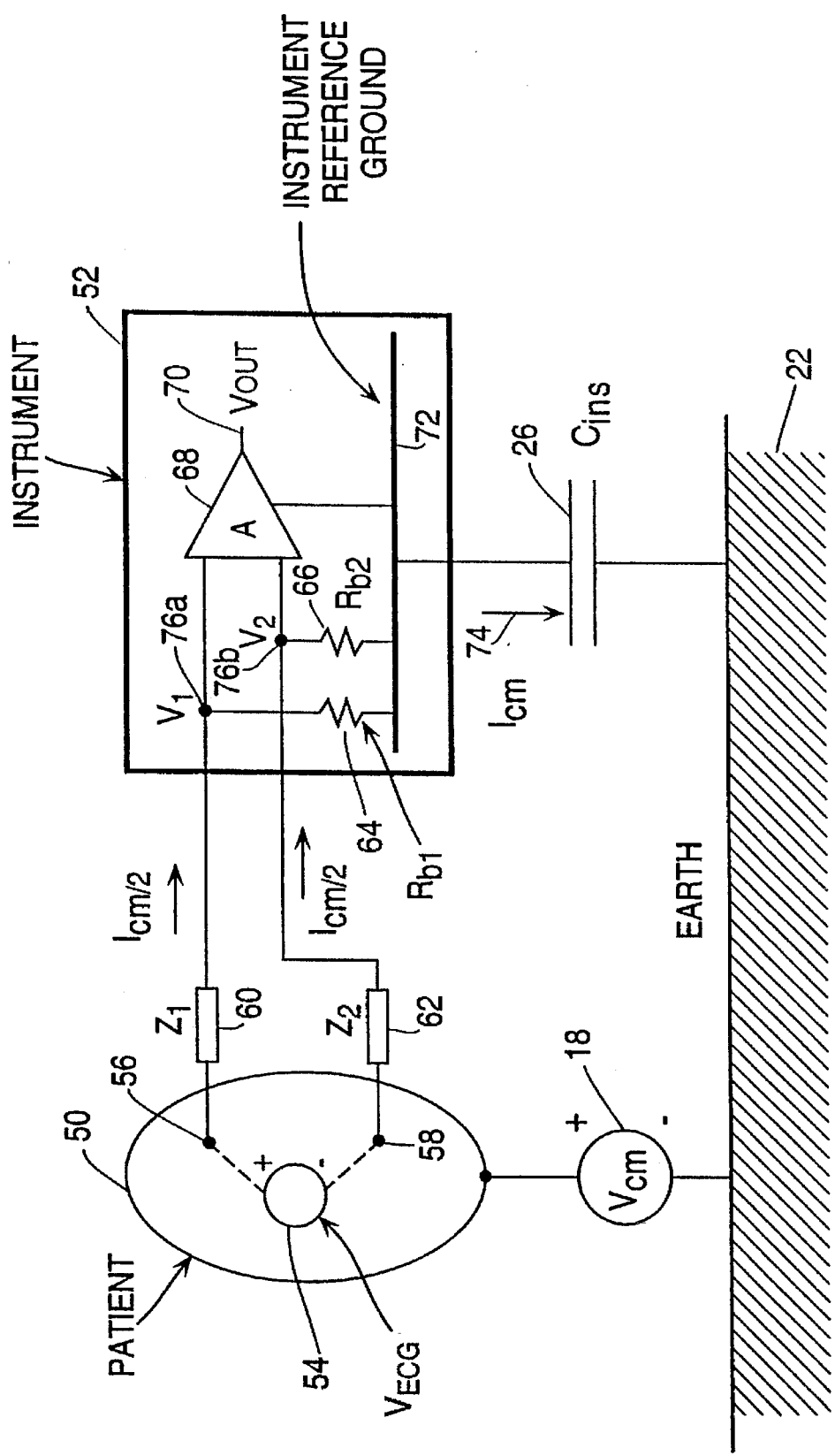
FIG. 6 is a schematic representation of a patient and a typical differential voltage detector in the presence of a common mode signal source.

To better understand the problems involved with superimposed common mode signals, FIG. 6 shows a schematic representation of patient 50 and typical differential voltage detector 52 in the presence of a common mode signal source.

The heart of patient 50 is depicted as a voltage source 54. Heart 54 acts as a varying electrical source whose voltage (hereinafter "$V_{ecg}$") varies as the heart operates; thus, producing the familiar heart beat rhythm seen in a typical electrocardiogram (ECG). The electrodes 56 and 58 are attached to the patient's body in advantageous positions so as to measure the differential voltage across heart 54. Electrodes 56 and 58 have an associated impedance that is schematically represented as impedances 60 and 62 denoted as $Z_1$ and $Z_2$, respectively.

The leads of the two electrodes are connected to heart monitor 52 to carry the input signal. Heart monitor 52 is schematically represented with circuitry that is typical in the art. The electrode leads give signal input into a differential instrumentation amplifier 68. Two bias resistors 64 and 66 connect the lead lines to instrument potential reference 72.

In operation, the differential voltage signal is sensed by instrumentation amplifier 68 and the differential voltage is supplied on $V_{out}$ line 70 after being amplified by a specified gain. The differential voltage output is thus used by subsequent blocks in the instrumentation (not shown) to analyze the signal as a measure of how well patient's heart 54 is functioning. In reality, $V_{out}$ is a combination of the differential heart voltage, $V_{ecg}$, and the artifact voltage signals, $V_{art}$, that arise from the interaction of common mode signals and the patient/instrumentation system. In equation form, we have:

$$V_{out} = V_{ecg} + V_{art} \quad (1)$$

The artifact voltage itself comprises a number of terms that contribute to its sum. These terms depend on both the common mode voltage and current present in the system. The common mode circuit is completed from earth 22 through common mode voltage source 18 ("$V_{cm}$"), patient 50, instrument 52, stray capacitance 26 and back to earth 22. Common mode current 74, ("$I_{cm}$"), follows this circuit until the current reaches patient 50. At patient 50, the common mode current divides. Using the assumption that $R_{b1}$ is approximately equal to $R_{b2}$, and that $R_{b1}$ is much larger that $Z_1$ or $Z_2$, it may be approximated that the current divides equally along the two electrode leads 56 and 58 with magnitude $I_{cm}/2$. Thus, in equation form, we may approximate:

$$V_{art} = \frac{A \cdot I_{cm}}{2} \times (Z_1 - Z_2) + \frac{A \cdot I_{cm}}{2} \times (R_{b1} - R_{b2}) + V_{cm} \times K_{cmr} \quad (2)$$

where A is the gain of the amplifier. From this equation, many observations may be made. First, the first term that comprises $V_{art}$ is due to the impedance difference between the electrodes that are attached to the patient. This impedance mismatch may arise from many sources—for example, from process variation in the manufacture of electrodes and, perhaps more importantly, from differences in the electrode/patient interface. Differences in the patient's skin at the electrode sites, differences in the quality of electrode contact with the patient's skin and other factors play a role in the impedance mismatch. Because these electrode impedances, $Z_1$ and $Z_2$, are seldom equal and because each electrode lead carries essentially the same current, namely $I_{cm}/2$, the common mode signal is "converted" into a differential signal that appears across input leads and becomes an output artifact of the instrumentation amplifier.

Second, the second and third terms that comprise $V_{art}$ arise because of an impedance imbalance between the bias resistors and the common mode rejection ratio (as will be explained below) for given amplifier 68 respectively. Thus, the second and third terms are functions of the instrumentation circuitry itself and remain a factor in artifact generation even with perfect patient connection. Regarding the second term, because there is always a slight difference in the actual resistances of bias resistors 64 and 66, a differential signal artifact will appear in the output. For example, average commercial resistors are rated for error tolerances of 5 or 10 percent. Where, in this case, impedance mismatch may lead to serious diagnostic consequences, more expensive resistors with smaller error tolerances (usually around one percent) are used. Thus, in bias resistors with values of 1 million ohms, a 1 percent error tolerance translates into a range of plus or minus 10,000 ohms. Although this error range may seem narrow, the resulting converted common mode signal may be great if large common mode currents are present. Static electricity, generated between any of the above identified interfaces, may be on the order of 7–10 thousand volts (D.C.); while overhead lights may generate 50 volts/m (A.C.) at 50–60 Hz.

As to the third term, in an actual instrumentation amplifier, there is always a certain amount of common mode voltage which is "passed through" and amplified—no matter how well designed and constructed the amplifier. The constant, $K_{cmr}$ in equation 2, is the "common mode rejection ratio" that is rated for a given amplifier. This ratio, multiplied by the common mode voltage, gives the amount of voltage that shows up at the output line as a result of the common mode voltage. Although this ratio is usually much less than 1 (i.e. the amount of common mode signal amplified is small to the amount of differential signal amplified), the amount of common mode voltage may, at times, be large enough to produce a significant amount of output voltage.

The "rated" common mode rejection ratio for a given amplifier differs from the "overall" common mode rejection of the entire instrumentation circuit. Thus, it is now desirable to quantify the "overall" common-mode rejection in terms of the elements comprising the circuit.

Turning attention again to FIG. 6, the overall common mode rejection ratio will now be determined. First, using AC circuit analysis, we may obtain the following equation for $I_{cm}$:

$$I_{cm} = \left| \frac{V_{cm}}{\frac{(Z_1 + R_{b1}) \cdot (Z_2 + R_{b2})}{(Z_1 + R_{b1} + Z_2 + R_{b2})} + \frac{1}{j \cdot C_{ins} \cdot 2 \cdot \pi \cdot f}} \right| \quad (3)$$

where $C_{ins}$ is the stray capacitance between the instrumentation and earth.

Next, the common mode voltage at the point of patient connection relative to instrumentation potential reference, $V_{cm\_ins}$, is seen to be:

$$V_{cm\_ins} = I_{cm} \cdot \frac{(Z_1 + R_{b1}) \cdot (Z_2 + R_{b2})}{(Z_1 + R_{b1} + Z_2 + R_{b2})} \quad (4)$$

Using $V_{cm\_ins}$, common mode voltages $V_1$ and $V_2$ (i.e. the voltages at nodes 76a and 76b respectively that arise from common mode voltage) are:

$$V_1 := V_{cm\_ins} \cdot \left( \frac{R_{b1}}{R_{b1}+Z_1} \right) \quad (5)$$

$$V_2 := V_{cm\_ins} \cdot \left( \frac{R_{b2}}{R_{b2}+Z_2} \right) \quad (6)$$

Having derived the common mode voltages $V_1$ and $V_2$ it is possible to get a quantitative measure of the overall common mode rejection ratio. It will be appreciated that the absolute value of the difference between $V_1$ and $V_2$ is equal to the second term of $V_{art}$ as seen in equation 2. It will be further appreciated that the overall common mode rejection ratio is proportional to the sum of the second and third terms of $V_{art}$. In equation form, this sum is expressed as follows:

$$\text{"Overall" } CMRR \propto |V_1 + (-V_2)| + V_{cm\_ins} \cdot K_{cmr} = \quad (7)$$

$$V_{cm\_ins} \cdot \left[ \left( \frac{R_{b1}}{R_{b1}+Z_1} \right) + \left( \frac{-R_{b2}}{R_{b2}+Z_2} \right) + K_{cmr} \right]$$

Figure 7:
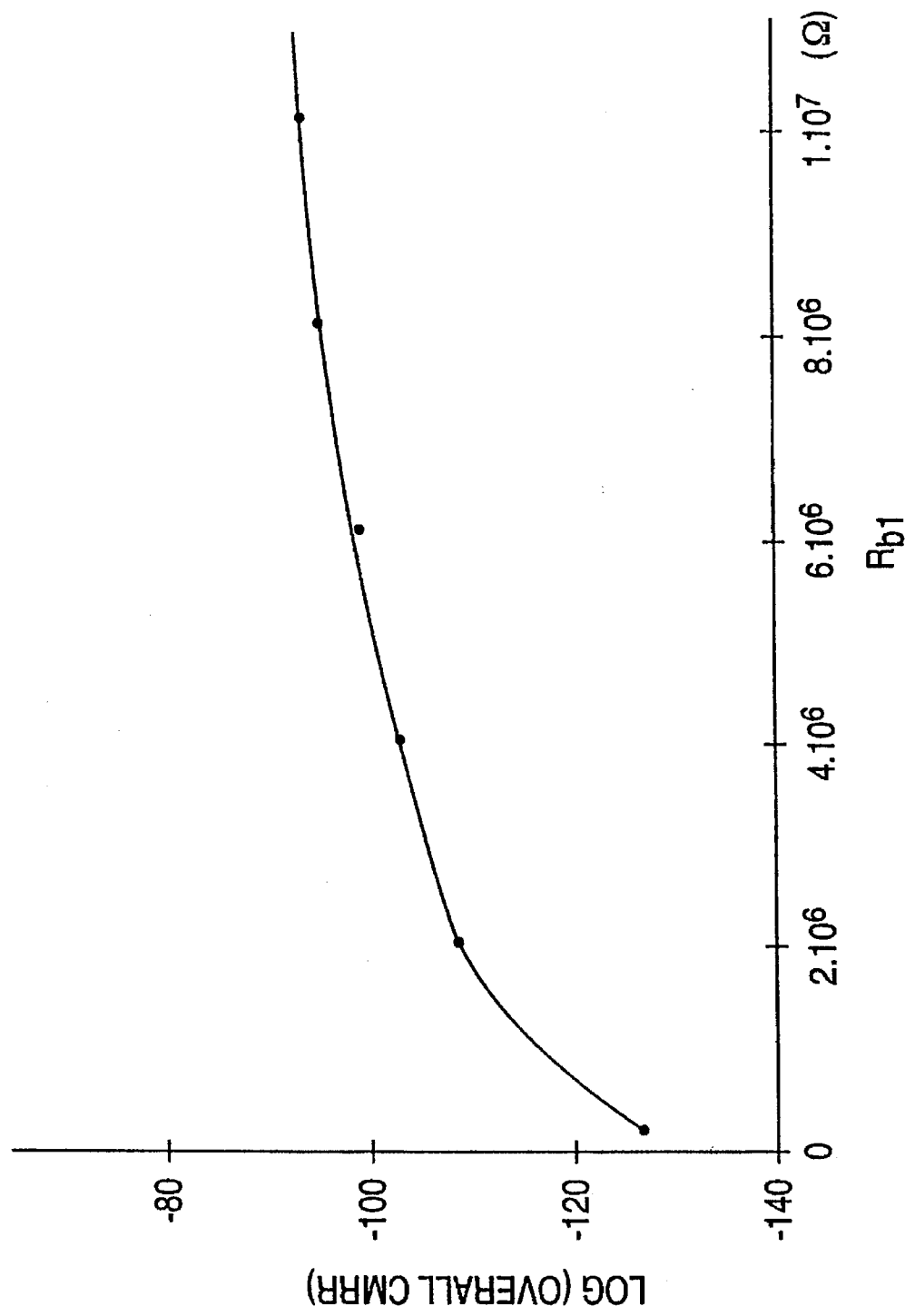
FIG. 7 graphically depicts a functional relationship between the common mode rejection ratio of the typical detector as shown in FIG. 6 and the value of its bias resistors.

Plotting this equation as a function of various bias resistor values shows a unique relationship between the overall common mode rejection ratio and the bias resistors. Specifically, FIG. 7 shows a log-graph of the overall common mode rejection ratio as a function of one of its bias resistors, namely $R_{b1}$. The graph assumes that $R_{b2}$ has a resistance that of 1.05 times that of $R_{b1}$ as a reasonable assumption based on known resistance error tolerances. As may be appreciated from the graph, it is desirable to lower the common mode input impedance (i.e. have a small $R_{b1}$ and $R_{b2}$) in order to maximize the overall common mode rejection ratio.

While it is desirable to keep the common mode impedance relative to the potential reference low, it is likewise desirable to keep the differential mode impedance high. In a conventional ECG amplifier first stage (or "front-end"), such as depicted in FIG. 6, this is not practical since the common mode impedance relative to potential reference is the parallel combination of the bias resistors; while the differential impedance is the sum of the bias resistors.

Figure 15:
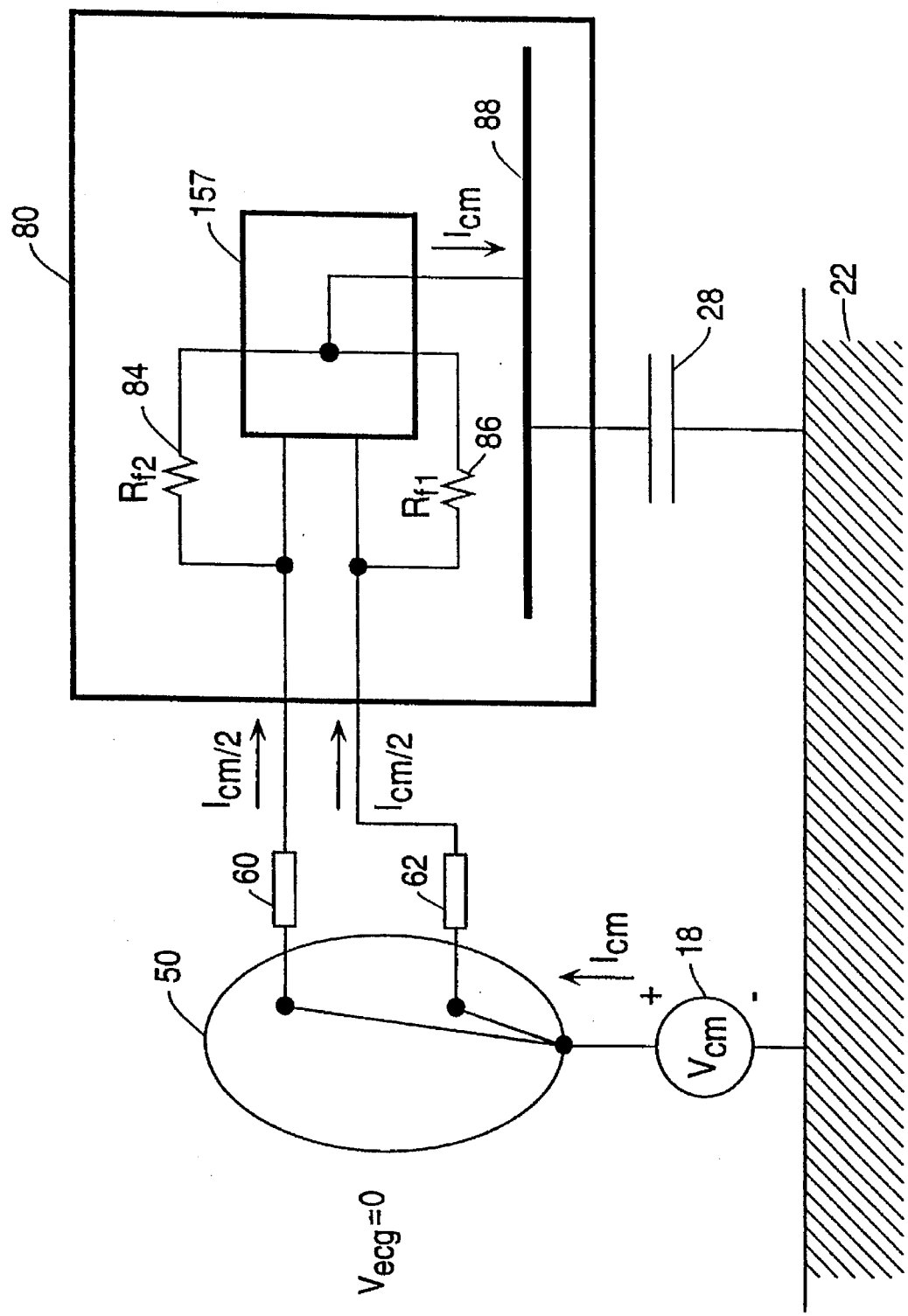
FIGS. 15 and 16 illustrate how the present invention operates in the context of a pure common mode signal environment and a pure differential mode signal environment respectively.
Figure 16:
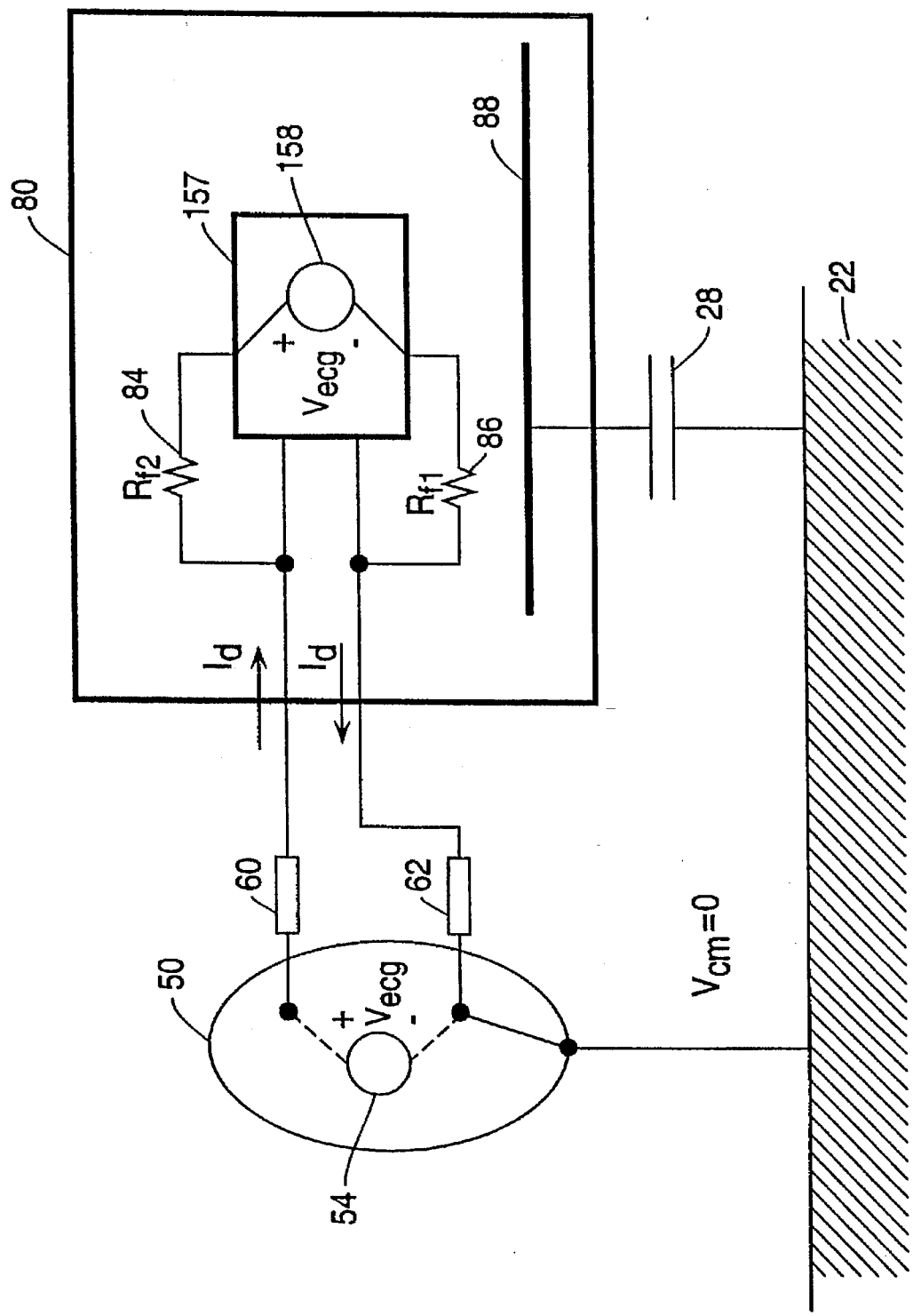

What is desired is a front-end architecture with a means for increasing the impedance to said differential mode signals while either maintaining the impedance to said common mode signals substantially constant or lowering the common mode impedance. The present invention incorporates a novel use of feedback to provide these opposing but desirable attributes. FIGS. 15 and 16 illustrate the basic concepts of the invention, while FIG. 8 provides a simplified schematic diagram of a front-end differential detector made in accordance with the principles of the present invention.

FIG. 15 illustrates the case of pure common mode signals. Common mode voltage source 18 ("$V_{cm}$") is connected to patient 50, with no ECG (i.e. $V_{ecg}=0$). Common mode input currents arising from voltage source 18 flow into the front-end via electrode impedances 60 and 62, thence via input impedance elements 84 and 86 into differential amplifier block 157 to potential reference 88, thence to earth 22. In this case, input impedance elements 84 and 86 act in the same manner as the bias resistors 64 and 66 of FIG. 6.

FIG. 16, by contrast, illustrates the case of pure differential mode input signals. In this case, patient 50 is not subject to common mode voltages (i.e. $V_{cm}=0$), but exhibits an ECG signal, $V_{ecg}$. Differential mode input currents induced by $V_{ecg}$ flow into one input terminal and return by the other. In this case, however, differential amplifier block 157 utilizes its means for increasing the impedance to said differential mode signals primarily by a means for providing feedback signals in opposition to said differential mode input signals. As can be seen in FIG. 16, amplifier 157 provides a voltage source 158 approximating $V_{ecg}$ to oppose differential input currents. In this manner, the effective values of $R_{f1}$ and $R_{f2}$ are multiplied with respect to differential input signals.

Figure 8:
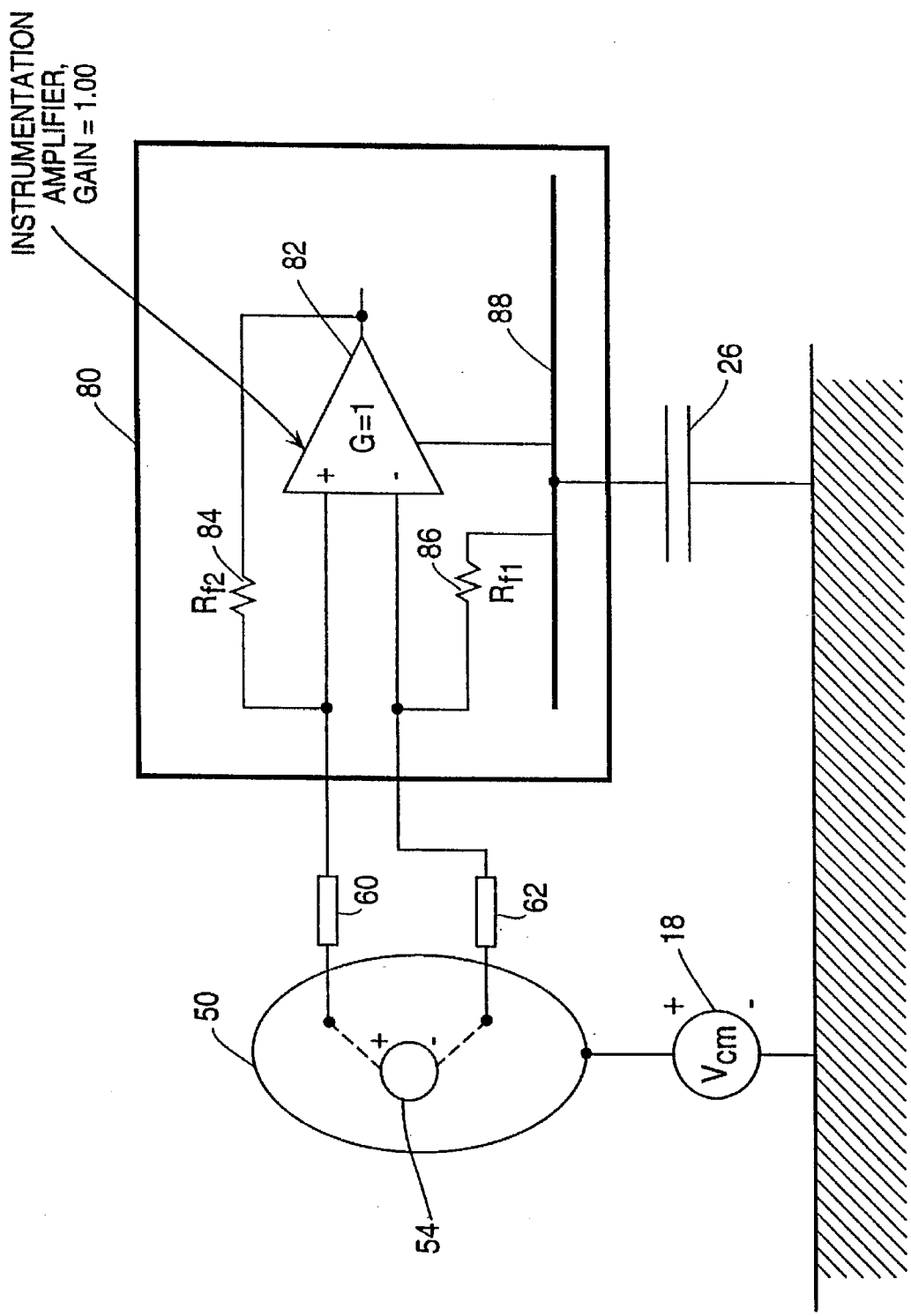
FIG. 8 is a simplified schematic diagram of a differential detector made in accordance with the principles of the present invention.

FIG. 8 is a simplified schematic diagram of a front-end differential detector made in accordance with the principles of the present invention. The features of the presently claimed architecture are easily seen—a differential instrumentation amplifier 82 with an output gain that is substantially unity (i.e. gain=1) and having an output node, and two input nodes—an inverting node (as designated by the "−" sign) and a non-inverting node (as designated by the "+" sign). A feedback signal is provided from output node of differential amplifier 82 to its non-inverting node.

The effect of this feedback line may be seen on accomplishing both common mode circuit analysis (i.e. where the input leads are presumed to be shorted) and differential mode analysis. Under common mode analysis, it may be shown by anyone skilled in the art that, with the input leads shorted together, the output of amp 82 will be held at instrumentation potential reference 88. Therefore, the common mode impedance relative to potential reference is the parallel combination of resistors $R_{f1}$ and $R_{f2}$.

Figure 9:
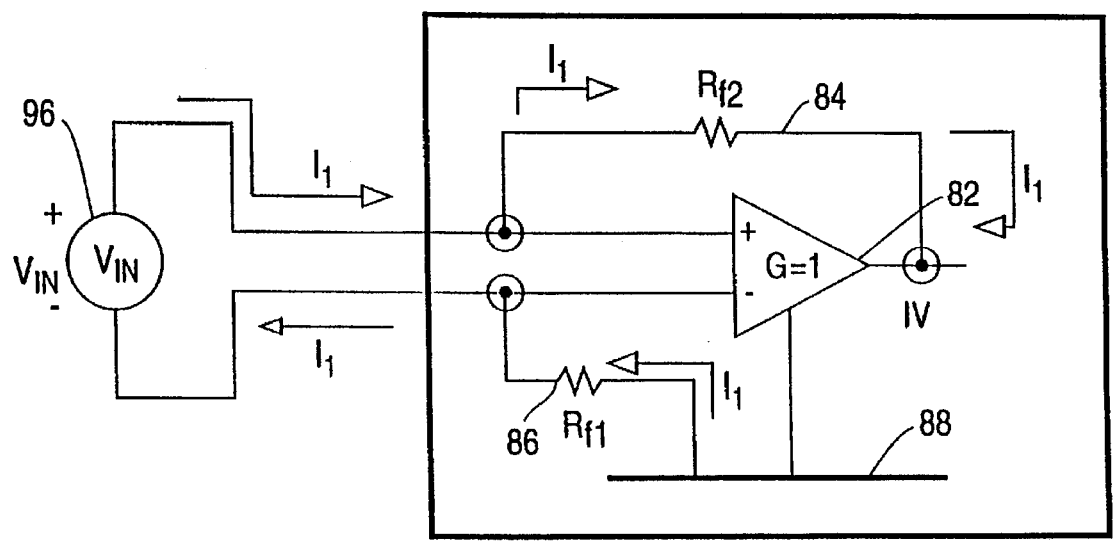
FIG. 9 depicts the differential mode analysis of the presently claimed differential detector.

Under differential mode analysis, it can be shown that a negligible current flows through either of the bias resistors; and thus the effective input resistance approaches infinity. FIG. 9 depicts the differential mode analysis of the presently claimed circuit. By placing a voltage source 96 ("$V_{in}$") across the input leads of amplifier 82, a differential-mode current, $i_1$, is induced in the instrumentation package as indicated. Voltage loop analysis yields the following equation:

$$I_1 = \frac{(V_{in} - [G \times V_{in}])}{(R_{f1} + R_{f2})} \quad (8)$$

$$= \frac{V_{in}}{(R_{f1} + R_{f2})} \times (1 - G)$$

The total input differential-mode impedance, $Z_{in}$, is thus given by the equation:

$$Z_{in} = \frac{V_{in}}{I_1} \quad (9)$$

$$= \frac{(R_{f1} + R_{f2})}{(1 - G)}$$

Therefore, as the gain of the amplifier, G, approaches unity (i.e. G=1), $Z_{in}$, the differential-mode impedance, approaches infinity. Thus, the presently claimed circuitry satisfies the twin goals of having low common mode impedance while simultaneously having high differential impedance.

It will be appreciated that the idealized situation in FIG. 9 is not very far-off the actual situation where the voltage source 96 is replaced by a beating heart. In an actual circuit, the gain of the instrumentation amplifier may not be exactly unity. However, the principles of the present invention work as well with commercially available instrumentation amplifiers with standard error tolerances. Thus, a practical circuit with a commercially available instrumentation amplifier produces high differential-mode input impedance with as much as a ten percent error in gain of the amplifier.

Figure 14A:
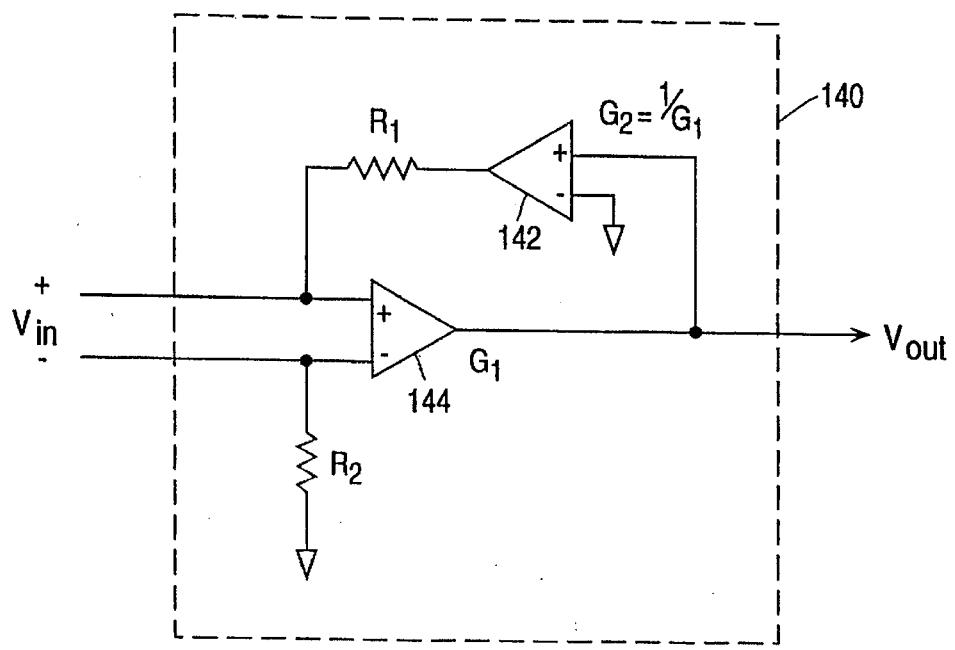
FIGS. 14A and 14B depict amplifier blocks that employ two or more amplifiers to create a substantially similar circuit to that of FIG. 9 that employs only a single amplifier of rated gain equal to one.
Figure 14B:
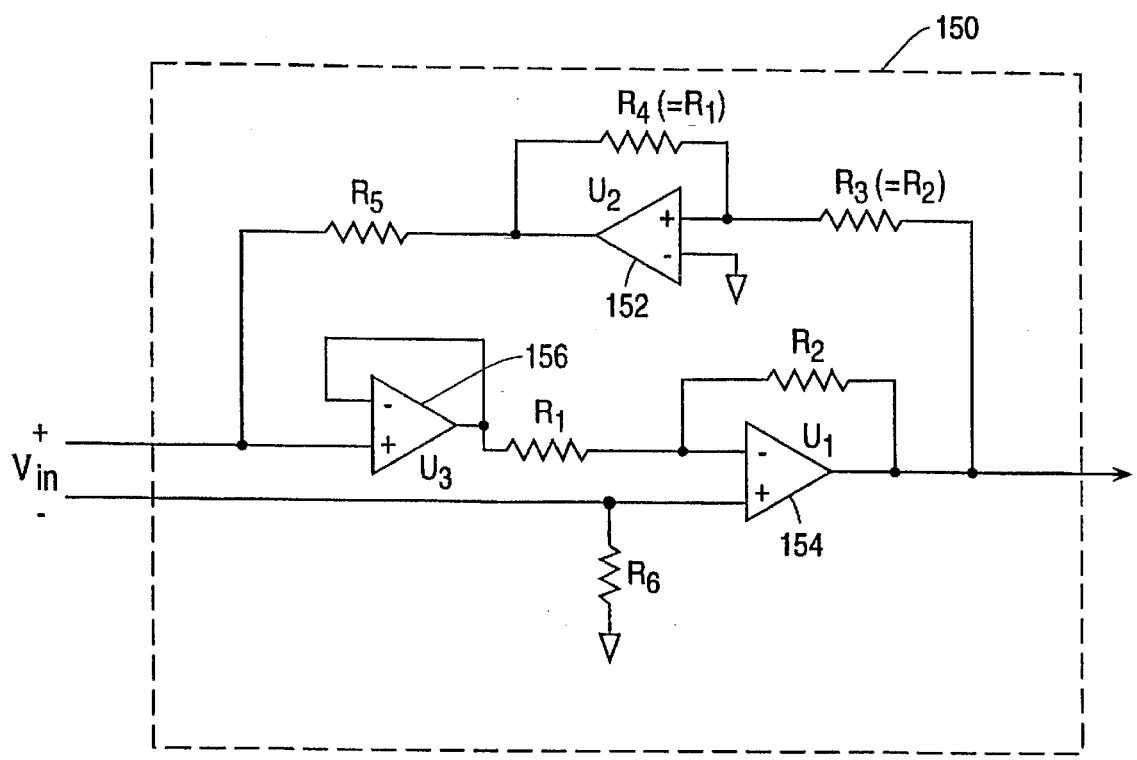

Although the above discussion assumes that the instrumentation includes only a single amplifier with approximately unity gain, this notion of an amplifier can be suitably generalized into an "amplifier block". Thus, an amplifier block is a circuit block comprising one or more amplifiers such that the circuit block itself exhibits unity "loop" gain with positive feedback. "Loop" gain is the gain registered at a node which is providing a feedback signal to the input. It will be further appreciated such an amplifier block may be easily constructed by those skilled in the art with two or more amplifiers having arbitrary gains. FIGS. 14A and 14B depict two possible "amplifier blocks" having multiple amplifiers that accomplish the same functionality as the above-described single amplifier with unity gain and positive feedback. FIG. 14A depicts amplifier block 140 that comprises two instrumentation amplifiers 142 and 144 that have rated gains of $G_1$ and $G_2$ (=1/$G_1$) respectively. It can be shown that the net loop gain of amplifier block 140 is $G_1 \times G_2 = 1$, which is the unity loop gain as required for a substantially similar circuit to that provide by FIG. 9.

FIG. 14B gives an example of an amplifier block 150 having three operational amplifiers 152, 154, and 156 with gains designated by $G_1$, $G_2$, and 1 respectively. The first stage amplifier 152 has a gain $G_2 = -R_2/R_1$. This is fed back through the second stage amplifier 154 with $G_1 = -R_4/R_3 = -R_1/R_2$. The "loop gain" of this circuit is therefore $G_1 \times G_2 = (-R_1/R_2) \times (-R_2/R_1) = 1$, which (as with the circuit of FIG. 14A) is the required unity gain. It will be appreciated that operational amplifier 156 with a gain of 1 is known in the art as a "follower" stage that prevents $R_1$ from modifying the input impedance.

As FIGS. 14A and 14B show, it is a very simple matter for one skilled in the art to construct substantially similar circuits employing two or more amplifiers. Thus, the present invention should not be limited to circuits that employ a single amplifier with a gain that is substantially equal to unity. Instead, the present invention should be construed to cover these additional embodiments where the "amplifier block" has a substantial loop gain of unity and possibly multiple amplifiers.

Having made the fundamental observation of the circuitry in relation to monitoring a patient's heart, several applications of the fundamental circuit will now be discussed. The first application of the presently claimed circuitry is a "patient impedance" monitor. Patient impedance is commonly used to determine whether or not the electrodes have been correctly attached to the patient. A high patient impedance may indicate that the electrodes are not very well connected to the patient; thus the instrumentation may be ineffectual either as a monitor or as a shock-therapy delivery system.

Figure 10:
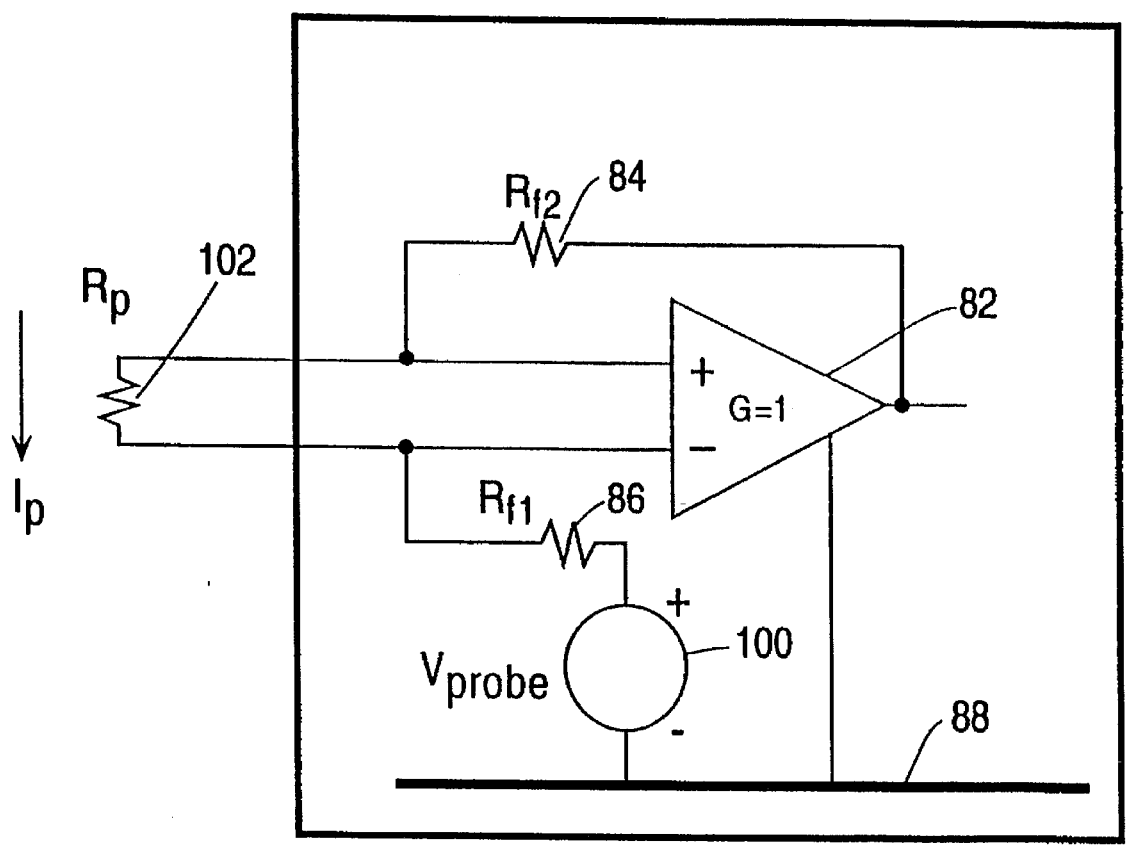
FIG. 10 depicts how the presently claimed differential detector can be used to monitor patient impedance in order to determine, among other things, how well the electrodes are attached to the patient.

Referring to FIG. 10, the essential idea in this application is to connect a probe voltage source 100 ("$V_{probe}$") to bias resistor 86 and instrumentation potential reference 88. The patient in this case is represented by impedance 102 ("$R_p$"). In the case $R_p = 0$, there is no differential input to instrumentation amplifier 82, so the output of amplifier 82 remains at 0. Thus, the current $I_p$, flowing through the patient, is equal to $V_{probe}/(R_{f1}+R_{f2})$.

In the case that $R_p$ does not equal 0, a voltage will be impressed across $R_p$. This voltage induces a current, $I_p$, which may be expressed as follows:

$$V_{probe} - I_p \cdot R_{f1} - I_p \cdot R_{f2} + (I_p \cdot R_p \cdot \text{gain} - I_p \cdot R_p) = 0 \quad (10)$$

$$V_{probe} = I_p \cdot (R_{f1} + R_{f2} + (R_p - R_p \cdot \text{gain})) \quad (11)$$

$$I_p = \frac{V_{probe}}{R_{f1} + R_{f2} + (R_p - R_p \cdot \text{gain})} \quad (12)$$

Thus, if gain=1, then $I_p = V_{probe}/(R_{f1}+R_{f2})$ and is not a function of $R_p$. Also, with gain=1, the output voltage of the amplifier is equal to the voltage across $R_p$, namely $I_p \times R_p$. Thus, once a current has been made by application of a $V_{probe}$ signal, the impressed voltage may be measured at the instrumentation amplifier output and the patient impedance may thus be determined as $V_{out}/I_p$, or equivalently, $V_{out} \times (R_{f1}+R_{f2})/V_{probe}$.

Preferably, $V_{probe}$ is an AC source having a selected frequency which distinguishes it from other voltage sources. In a current embodiment, $V_{probe}$ is chosen to be one-volt AC at 540 Hz. At this frequency, $V_{probe}$ is distinguishable from other common AC sources such as overhead lighting (usually rated at 60 Hz in the United States or 50 Hz in European countries), and ECG source generated by patient's heart (typically 0–100 Hz). The frequency 540 Hz is selected to make subsequent filtering relatively easy with digital filters. Additionally, it is also far enough from ECG frequencies (0–100 Hz) that the ECG information is easily separable with proper filters, but is not so high in frequency that stray capacitances are an issue.

Figure 11:
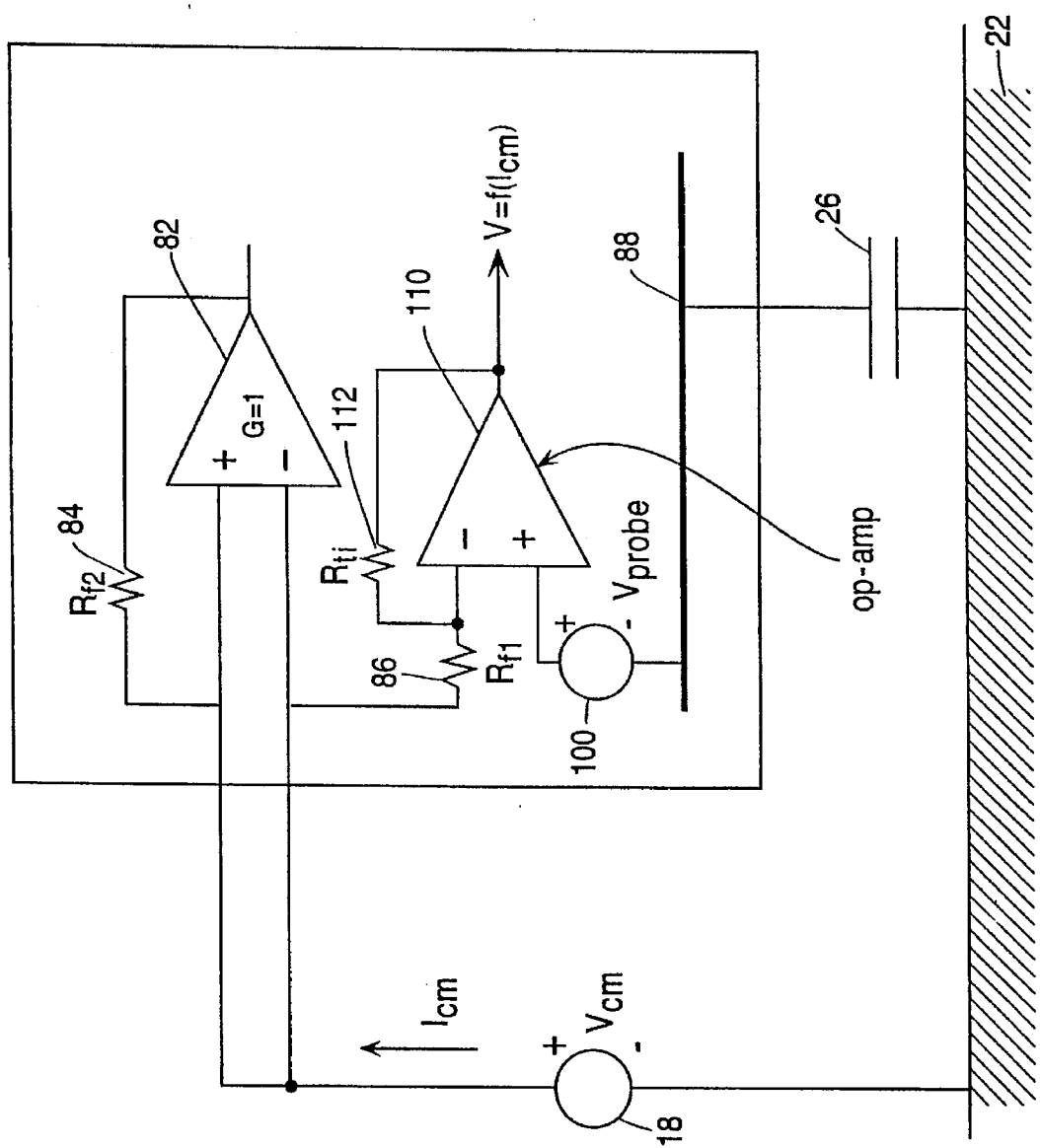
FIG. 11 depicts how the presently claimed differential detector can be used to monitor the common mode signal to determine if the common mode signal is too large an artifact signal being superimposed on the patient's heart signal.

Yet another application of the present invention is to monitor the common mode signal by converting the common mode current into measurable output voltage. FIG. 11 shows a modified circuit that allows common mode signal monitoring. In order to monitor common mode signal, operational amplifier 110 and resistor 112 are added to the basic circuit of FIG. 10.

As common mode current enters the instrumentation, it has the choice of traveling down $R_{f2}$ to the small signal ground provided at the output of instrumentation amplifier 82. Otherwise, the current could flow to the virtual ground at the inverting node of operational amplifier 110. If $R_{f1}$ and $R_{f2}$ are equal, the current will split evenly because operational amplifier 110 keeps the voltage at its inverting node equal to the voltage at its non-inverting node—which is $V_{probe}$.

Because half of the common mode current is input into the added operational amplifier stage, a voltage approximately equal to $I_{cm}/2 \times R_{ti}$ appears at the output of the operational amplifier. A superimposed voltage due to $V_{probe}$ also appears at the output, but is separable from the common-mode signal by suitable filtering. Thus, the common mode signal can be monitored as a function of the output voltage of operational amplifier 110.

Figure 12:
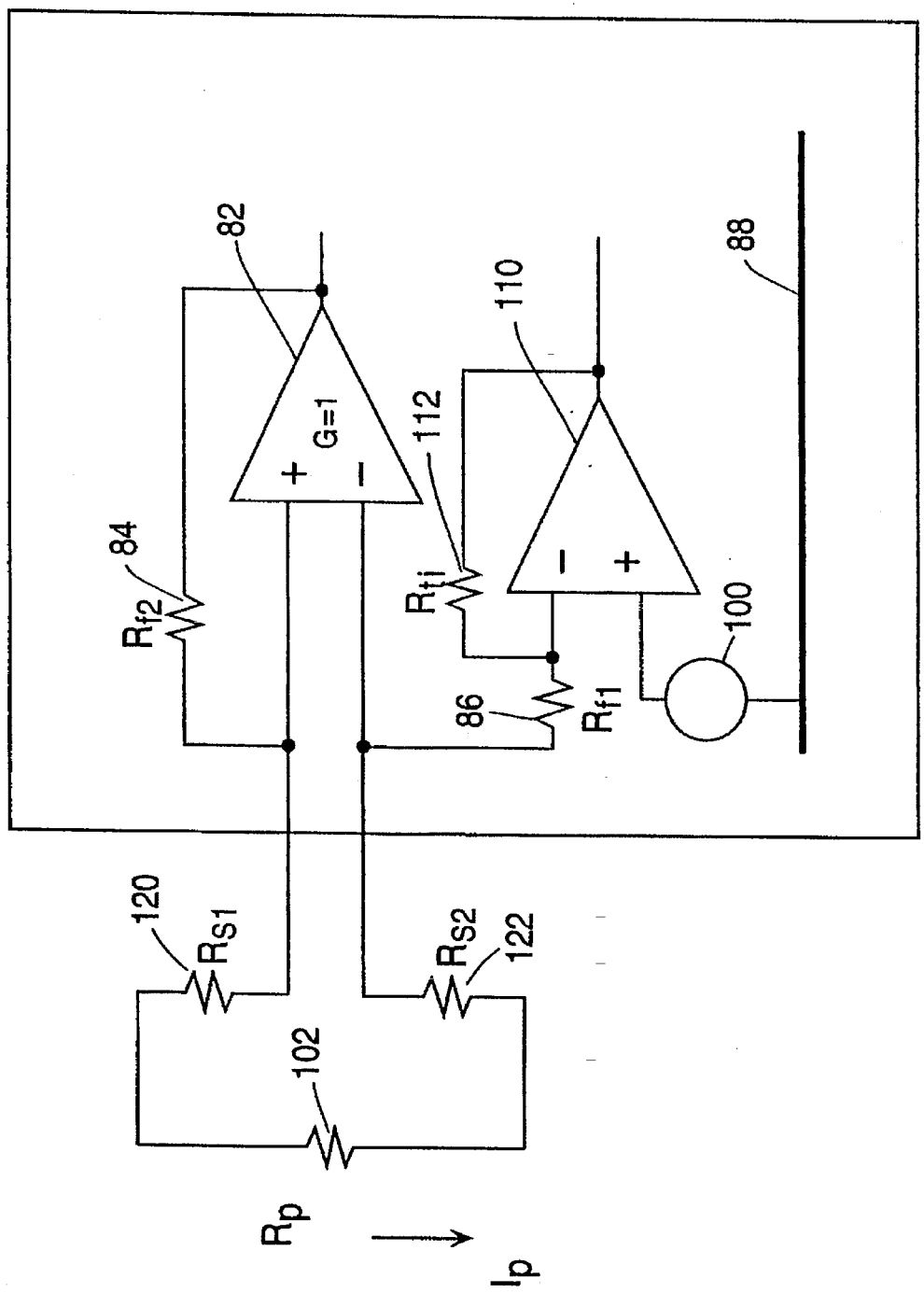
FIG. 12 details the addition of two resistive elements to the presently claimed detector circuitry to insure that a minimum voltage is detected at the differential input, even if the electrodes at the patient are experiencing a short circuit.

FIG. 12 details how the addition of two resistive elements, $R_{s1}$ (120) and $R_{s2}$ (122), allows for continuous fault detection in the circuit. Further, this configuration distinguishes between a short of the patient's electrodes (or electrode cables) versus other types of circuit faults. Without added resistors 120 and 122, if the patient's electrodes (or electrode cables) are shorted (i.e. $R_p=0$), then the output of operational amplifier 82 is 0, regardless of the value of $V_{probe}$.

By contrast, by adding resistors 120 and 122 to the circuit, a minimum differential voltage of detectable amplitude and frequency of $V_{probe}$ appears at the output of operational amplifier 82 so long as the circuit is functional.

For example, if $R_p=0$ and no other faults exist in the circuit, then the output voltage is of a certain known amplitude and frequency which is wholly dependant upon the signal of $V_{probe}$ and the circuit elements. However, if other faults exist (such as a break in a lead wire), then the output voltage deviates from this known output signal. It will be appreciated that other particular faults may have their own particular output signal that allows for their identification.

Figure 13:
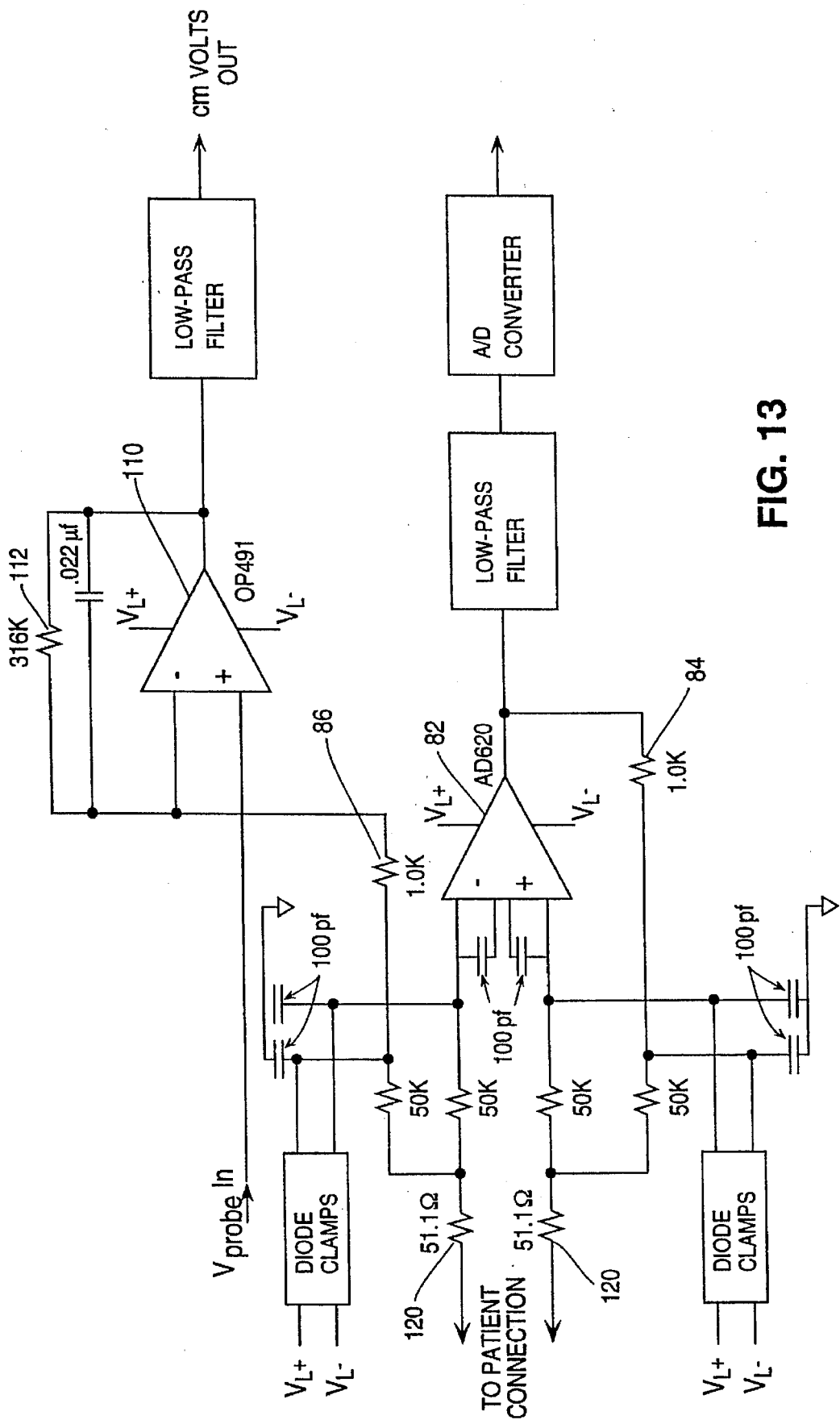
FIG. 13 is a more detailed schematic description of the presently claimed differential detector.

The above advantages and features of the presently claimed detection circuitry are given a more detailed schematic description in FIG. 13. The major functional components, as described above in conjunction with FIGS. 8 through 12, are seen in FIG. 13 with like numerals describing like components. It will be appreciated that FIG. 13 is a present embodiment having sample component values and designations and that the present invention should not be limited to any particular value or designation of component. Neither should the present invention be particularly limited to the specific circuit arrangement shown in FIG. 13.

There has thus been shown and described a novel apparatus for the detection and suppression of common mode signals in instrumentation systems which meets the objects and advantages sought. As stated above, many changes, modifications, variations and other uses and applications of the subject invention will, however, become apparent to those skilled in the art after considering this specification and accompanying drawings which disclose preferred embodiments thereof. All such changes, modifications, variations and other uses and applications which do not depart from the spirit and scope of the invention are deemed to be covered by the invention which is limited only by the claims which follow.

We claim:

1. In an electrical circuit that detects differential mode signals in an environment where differential mode signals potentially co-exist with common mode signals wherein said circuit comprising, first and second input leads through which both common mode and differential mode signals are input from at least one signal source, a differential amplifier block having at least an output lead, an inverting node and a non-inverting node connected to said first and second input leads respectively, said amplifier block having a substantial differential gain of one and such that the signal from said output lead is input into said non-inverting node, a potential reference, a voltage source connected to said potential reference and to said inverting node of said amplifier block, an input lead resistor connected to one of said input leads and its corresponding amplifier block node, a method for continuous fault detection in said electrical circuit while detecting signals from a patient, the steps of said method comprising:

a) attaching the first and second input leads to the patient;
   b) inputting a known voltage signal from said voltage source into the inverting node of the amplifier block;
   c) monitoring the voltage signal on the output lead of the amplifier block; and
   d) determining if fault conditions exist in the circuit based on the voltage signal received at the output lead.

2. The method as recited in claim 1 wherein the step of inputting a known voltage signal comprises inputting a known alternating voltage signal.

3. The method as recited in claim 2 wherein the step of inputting a known alternating voltage signal comprises inputting a known alternating voltage signal having a frequency substantially distinguishable from said common mode signal.

4. The method as recited in claim 1 wherein the step of inputting a known voltage signal comprises inputting a known voltage signal from a probe voltage source.

5. The method as recited in claim 1 wherein the step of inputting a known voltage signal comprises inputting a known voltage signal from a circuit, said circuit comprising:

a second operational amplifier block having an inverting node, a non-inverting node, and an output lead;

a first resistor connected to said inverting node of said differential amplifier block and to said inverting node of said second amplifier block;

a second resistor connected to said output lead of said second operational amplifier block and to said inverting node of said amplifier block; and a probe voltage source connected to said potential reference and to said non-inverting node of said second amplifier block.

6. The method as recited in claim 1 wherein the step of determining if fault conditions exist further comprises determining if a short circuit in the input leads exists if the voltage signal received at the output node relates to the known voltage signal when the input leads are intentionally shorted.

* * * * *

UNITED STATES PATENT AND TRADEMARK OFFICE
CERTIFICATE OF CORRECTION

PATENT NO. : 5,632,280

DATED : 27 May 1997

INVENTOR(S): Kent W. Leyde, Thomas D. Lyster, Daniel J. Powers

It is certified that errors appear in the above-identified patent and that said Letters Patent is hereby corrected as shown below:

In column 3, line 34, "corrosion-mode" should be "common-mode".

In column 1, line 40, "a" should be — an —.

In column 2, line 59, "in" should be — is —.

In column 4, line 9, delete "the".

In column 4, line 20, "a" should be — an —.

In column 4, line 36, "indicated" should be — indicate —.

In column 7, line 27, delete "that" (first occurrence).

In column 8, line 31, "$i_1$" should be —$I_1$—.

In column 9, line 3, insert "that" after "appreciated".

In column 9, line 14, "provide" should be — provided —.

Signed and Sealed this

Tenth Day of March, 1998

BRUCE LEHMAN

*Attest:*

*Attesting Officer*     Commissioner of Patents and Trademarks